United States Patent
Lassalle-Balier et al.

(10) Patent No.: US 10,840,001 B2
(45) Date of Patent: Nov. 17, 2020

(54) MAGNETORESISTANCE ELEMENT WITH EXTENDED LINEAR RESPONSE TO MAGNETIC FIELDS

(71) Applicant: Allegro MicroSystems, LLC, Manchester, MA (US)

(72) Inventors: Rémy Lassalle-Balier, Bures sur Yvette (FR); Bryan Cadugan, Bedford, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 172 days.

(21) Appl. No.: 15/913,072

(22) Filed: Mar. 6, 2018

(65) Prior Publication Data
US 2019/0279804 A1  Sep. 12, 2019

(51) Int. Cl.
*H01F 10/32* (2006.01)
*H01F 41/30* (2006.01)
*G01R 33/09* (2006.01)

(52) U.S. Cl.
CPC ....... *H01F 10/3272* (2013.01); *G01R 33/093* (2013.01); *H01F 10/3254* (2013.01); *H01F 10/3263* (2013.01); *H01F 10/3286* (2013.01); *H01F 41/307* (2013.01); *G01R 33/098* (2013.01)

(58) Field of Classification Search
None
See application file for complete search history.

(56) References Cited

U.S. PATENT DOCUMENTS

| | | | |
|---|---|---|---|
| 6,888,742 B1 * | 5/2005 | Nguyen | G11C 11/15 365/145 |
| 8,779,764 B2 | 7/2014 | Meguro et al. | |
| 9,431,031 B1 * | 8/2016 | Xiao | G11B 5/11 |
| 9,529,060 B2 | 12/2016 | Fermon et al. | |
| 9,666,214 B1 * | 5/2017 | Bertero | G11B 5/3906 |
| 9,812,637 B2 * | 11/2017 | Fermon | G01R 33/093 |
| 9,922,673 B2 | 3/2018 | Campiglio et al. | |
| 10,762,941 B2 * | 9/2020 | Shiokawa | H01L 27/228 |
| 2006/0072249 A1 * | 4/2006 | Wakui | G01R 33/093 360/324.1 |
| 2007/0019338 A1 | 1/2007 | Childress et al. | |
| 2008/0042779 A1 * | 2/2008 | Carey | G11B 5/3166 333/167 |
| 2008/0117552 A1 * | 5/2008 | Zhou | B82Y 10/00 360/319 |
| 2009/0002898 A1 * | 1/2009 | Childress | B82Y 25/00 360/324.1 |
| 2010/0327857 A1 | 12/2010 | Hoshiya et al. | |
| 2011/0013317 A1 * | 1/2011 | Kaiser | B82Y 25/00 360/235.4 |

(Continued)

OTHER PUBLICATIONS

U.S. Appl. No. 15/600,186, filed May 19, 2017, Campiglio et al.
(Continued)

*Primary Examiner* — Kevin M Bernatz
(74) *Attorney, Agent, or Firm* — Daly, Crowley, Mofford & Durkee, LLP

(57) ABSTRACT

A magnetoresistance element assembly has two stacks of material layers with respective reference layers and respective bias layers that have relative magnetic directions that are not perpendicular to each other. Bias layers in the two stacks have bias magnetic directions that oppose each other. Linear range is increased.

27 Claims, 12 Drawing Sheets

*1100

| | | | | | |
|---|---|---|---|---|---|
| Cap | | Ta | 1142 | 5 nm | Non-magnetic |
| Pinning | | PtMn | 1140 | 18 nm | Antiferromagnetic |
| Pinned | ⊙ | CoFe | 1138 | 2.0 nm | Ferromagnetic |
| Pinned (SAF) — Spacer | 1154 — Ru | | 1136 | 0.85 nm | Non-magnetic |
| Pinned | ⊗ | CoFe | 1134 | 2.1 nm | Ferromagnetic |
| Spacer | | Cu | 1132 | 2.3 nm | Non-magnetic |
| Free | 1146 — CoFe | | 1130 | 1.5 nm | Ferromagnetic |
| | | NiFe | 1128 | 3 nm | Ferromagnetic |
| Spacer | | Ru | 1126 | 1.6 nm | Non-magnetic |
| Pinned | 1150 — CoFe | | 1124 | 2.0 nm | Ferromagnetic |
| Pinning | | PtMn | 1122 | 15 nm | Antiferromagnetic |
| Pinned | 1148 — CoFe | | 1120 | 2.0 nm | Ferromagnetic |
| Spacer | | Ru | 1118 | 1.8 nm | Non-magnetic |
| Free | | NiFe | 1116 | 3.0 nm | Ferromagnetic |
| | 1144 CoFe | | 1114 | 1.5 nm | Ferromagnetic |
| Spacer | | Cu | 1112 | 2.3 nm | Non-magnetic |
| Pinned | ⊗ | CoFe | 1110 | 2.1 nm | Ferromagnetic |
| Pinned (SAF) — Spacer | 1152 — Ru | | 1108 | 0.85 nm | Non-magnetic |
| Pinned | ⊙ | CoFe | 1106 | 2.0 nm | Ferromagnetic |
| Pinning | | PtMn | 1104 | 18 nm | Antiferromagnetic |
| Seed | | Ru | 1102 | 1.0 nm | Non-magnetic |

(56) References Cited

U.S. PATENT DOCUMENTS

| | | | |
|---|---|---|---|
| 2011/0062537 A1 | 3/2011 | Oh et al. | |
| 2011/0163739 A1 | 7/2011 | Ono et al. | |
| 2012/0112741 A1 | 5/2012 | Meguro et al. | |
| 2013/0082696 A1* | 4/2013 | Le | G01R 33/0011 324/244 |
| 2013/0161770 A1* | 6/2013 | Meng | H01L 43/12 257/421 |
| 2014/0001585 A1* | 1/2014 | Dimitrov | H01L 43/08 257/421 |
| 2014/0111195 A1 | 4/2014 | Kuo et al. | |
| 2014/0168818 A1* | 6/2014 | Sapozhnikov | G11B 5/3909 360/235.4 |
| 2014/0268405 A1* | 9/2014 | Machita | G01R 33/093 360/75 |
| 2014/0293474 A1* | 10/2014 | Yamane | G11B 5/3932 360/75 |
| 2015/0002962 A1* | 1/2015 | Singleton | G11B 5/3929 360/235.4 |
| 2015/0147481 A1* | 5/2015 | Braganca | G11B 5/3912 427/529 |
| 2015/0177285 A1* | 6/2015 | Higashi | G01R 19/0092 324/144 |
| 2015/0228321 A1* | 8/2015 | Lee | G11C 11/1675 365/158 |
| 2017/0194023 A1* | 7/2017 | Okawa | G11B 5/3912 |
| 2019/0178954 A1* | 6/2019 | Lassalle-Balier | G01R 33/093 |
| 2019/0259520 A1* | 8/2019 | Lassalle-Balier | G01R 33/093 |
| 2020/0076369 A1* | 3/2020 | Nunn | G11C 11/1673 |

OTHER PUBLICATIONS

U.S. Appl. No. 15/837,511, filed Dec. 11, 2017, Lassalle-Balier et al.

Extended European Search Report dated Aug. 8, 2019 for European Application No. 19161147.4; 8 Pages.

Response to European Office Action dated Mar. 11, 2020 for European Application No. 19161147.4; 19 Pages.

* cited by examiner

| | | | | | |
|---|---|---|---|---|---|
| Cap | | Ta | 1142 | 5 nm | Non-magnetic |
| Pinning | | PtMn | 1140 | 18 nm | Antiferromagnetic |
| Pinned | | CoFe | 1138 | 2.0 nm | Ferromagnetic |
| Spacer | 1154 | Ru | 1136 | 0.85 nm | Non-magnetic |
| Pinned | | CoFe | 1134 | 2.1 nm | Ferromagnetic |
| Spacer | | Cu | 1132 | 2.3 nm | Non-magnetic |
| Free | 1146 | CoFe | 1130 | 1.5 nm | Ferromagnetic |
| | | NiFe | 1128 | 3 nm | Ferromagnetic |
| Spacer | | Ru | 1126 | 1.6 nm | Non-magnetic |
| Pinned | 1150 | CoFe | 1124 | 2.0 nm | Ferromagnetic |
| Pinning | | PtMn | 1122 | 15 nm | Antiferromagnetic |
| Pinned | 1148 | CoFe | 1120 | 2.0 nm | Ferromagnetic |
| Spacer | | Ru | 1118 | 1.8 nm | Non-magnetic |
| Free | | NiFe | 1116 | 3.0 nm | Ferromagnetic |
| | 1144 | CoFe | 1114 | 1.5 nm | Ferromagnetic |
| Spacer | | Cu | 1112 | 2.3 nm | Non-magnetic |
| Pinned | | CoFe | 1110 | 2.1 nm | Ferromagnetic |
| Spacer | 1152 | Ru | 1108 | 0.85 nm | Non-magnetic |
| Pinned | | CoFe | 1106 | 2.0 nm | Ferromagnetic |
| Pinning | | PtMn | 1104 | 18 nm | Antiferromagnetic |
| Seed | | Ru | 1102 | 1.0 nm | Non-magnetic |

1100

Pinned (SAF): 1138, 1136, 1134
Pinned (SAF): 1110, 1108, 1106

*FIG. 11*

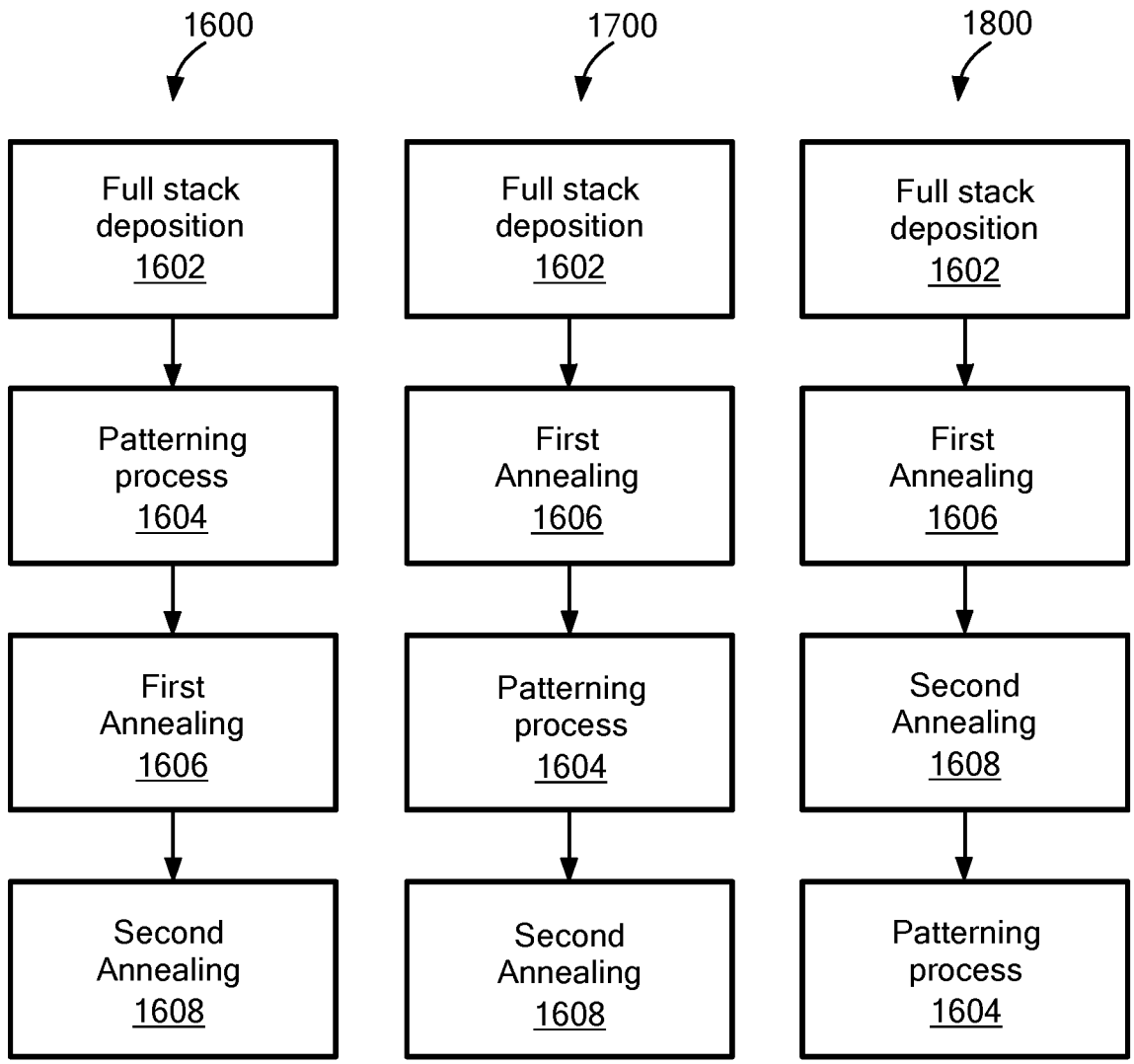

MAGNETORESISTANCE ELEMENT WITH EXTENDED LINEAR RESPONSE TO MAGNETIC FIELDS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to spin electronics magnetoresistance elements and, more particularly, to spin valve giant magnetoresistance (GMR) elements and spin valve tunnel magnetoresistance (TMR) elements that provide an extended range of linear response to magnetic fields.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a giant magnetoresistance (GMR) element, and a tunneling magnetoresistance (TMR) element, also called a magnetic tunnel junction (MTJ) element.

Of these magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to another layer so-called "reference layer." The free layer and the reference layer are described more fully below.

The magnetoresistances element may be used as a single element or, alternatively, may be used as two or more magnetoresistance elements arranged in various configurations, e.g., a half bridge or full bridge.

As used herein, the term "magnetic field sensor" is used to describe a circuit that uses one or more magnetic field sensing elements, generally in combination with other circuits. In a typical magnetic field sensor, the magnetic field sensing element and the other circuits can be integrated upon a common substrate, for example, a semiconductor substrate. In some embodiments, the magnetic field sensor can also include a lead frame and packaging.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field.

GMR and TMR elements are known to have a relatively high sensitivity, compared, for example, to Hall elements. GMR and TMR elements are also known to have moderately good linearity, but over a restricted range of magnetic fields, more restricted in range than a range over which a Hall element can operate linearly. Also, it is known that some GMR and TMR elements tend to change behavior after high temperature storage. Thus, it would be desirable to provide a GMR or a TMR element that has good linearity over a wider range of magnetic fields and at a higher temperature.

Conventional GMR and TMR elements, and, in particular, spin valves, are also known to have a magnetic asymmetry that can result in a linear region that is not centered about zero magnetic field, and, in AC operation, can result in a non-fifty percent duty cycle of an output signal. Thus, it would be desirable to provide a GMR or a TMR element with an improved magnetic symmetry.

SUMMARY

The present invention provides a GMR or a TMR element that has good linearity over a wider range of magnetic fields and, in some embodiments, at a higher temperature. In some embodiments, the present invention also provides a GMR or a TMR element with an improved magnetic symmetry.

In accordance with an example useful for understanding an aspect of the present invention, a magnetoresistance element assembly can include a first stack of material layers disposed over a substrate. The first stack of material layers can include first reference layers comprising a first reference magnetic direction. The first stack of material layers can also include first bias layers comprising a first bias magnetic direction. The first stack of material layers can also include first free layers experiencing the first bias magnetic direction. The magnetoresistance element assembly can further include a second stack of material layers disposed over the substrate. The second stack of material layers can include second reference layers comprising a second reference magnetic direction. The second stack of material layers can also include second bias layers comprising a second bias magnetic direction. The second stack of material layers can also include second free layers experiencing the second bias magnetic direction. The first and second reference magnetic directions can be parallel to each other. A relative angle between the first reference magnetic direction and the first bias magnetic direction can be between fifty and eighty-five degrees or between ninety-five and one hundred thirty degrees. The second bias direction can be parallel to and opposite to the first bias magnetic direction.

In accordance with another example useful for understanding another aspect of the present invention, a method of forming a magnetoresistance element assembly, can include forming a first stack of material layers disposed over a substrate. The first stack of material layers can include first reference layers comprising a first reference magnetic direction. The first stack of material layers can also include first bias layers comprising a first bias magnetic direction. The first stack of material layers can also include first free layers experiencing the first bias magnetic direction. The method can also include forming a second stack of material layers disposed over the substrate. The second stack of material layers can include second reference layers comprising a second reference magnetic direction. The second stack of material layers can also include second bias layers comprising a second bias magnetic direction. The second stack of material layers can also include second free layers experiencing the second bias magnetic direction. The first and second reference magnetic directions can be parallel to each other. A relative angle between the first reference magnetic direction and the first bias magnetic direction can be between fifty and eighty-five degrees or between ninety-five and one hundred thirty degrees. The second bias direction can be parallel to and opposite to the first bias magnetic direction.

In accordance with another example useful for understanding another aspect of the present invention, a magnetoresistance element assembly can include means for forming a first stack of material layers disposed over a substrate. The first stack of material layers can include first reference layers comprising a first reference magnetic direction. The first stack of material layers can also include first bias layers comprising a first bias magnetic direction. The first stack of material layers can also include first free layers experiencing the first bias magnetic direction. The magnetoresistance element assembly can further include means for forming a second stack of material layers disposed over the substrate. The second stack of material layers can include second reference layers comprising a second reference magnetic direction. The second stack of material layers can also include second bias layers comprising a second bias magnetic direction. The second stack of material layers can also include second free layers experiencing the second bias magnetic direction. The first and second reference magnetic directions can be parallel to each other. A relative angle between the first reference magnetic direction and the first bias magnetic direction can be between fifty and eighty-five degrees or between ninety-five and one hundred thirty degrees. The second bias direction can be parallel to and opposite to the first bias magnetic direction.

BRIEF DESCRIPTION OF THE DRAWINGS

The foregoing features of the invention, as well as the invention itself may be more fully understood from the following detailed description of the drawings, in which:

FIG. 11 is a pictorial of an illustrative dual double pinned magnetoresistance element, for example, a dual double pinned GMR element or a dual double pinned TMR element, having reference layers and two sets of bias layers;

FIGS. 16-18 show flowcharts showing processes for annealing an illustrative dual or single double pinned magnetoresistance element, for example, a GMR or a TMR element.

DETAILED DESCRIPTION

Figure 1:
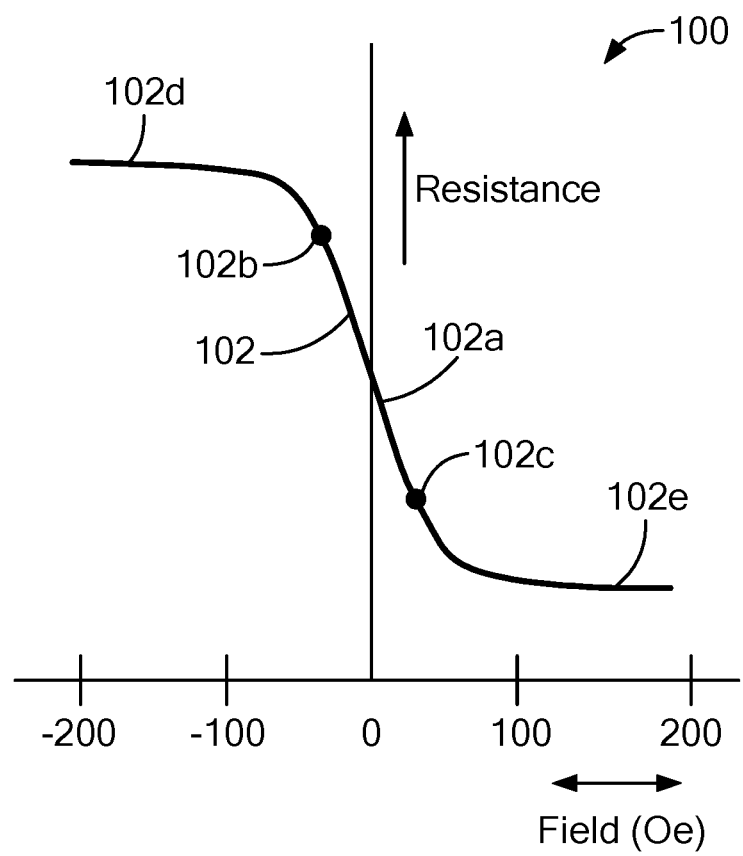
FIG. 1 is a graph showing an ideal resistance transfer function of a dual double pinned magnetoresistance element, for example, a dual double pinned GMR element.

Before describing the present invention, it should be noted that reference is sometimes made herein to GMR or TMR elements having particular shapes (e.g., yoke shaped or pillar shaped). One of ordinary skill in the art will appreciate, however, that the techniques described herein are applicable to a variety of sizes and shapes.

As used herein, the term "anisotropy" or "anisotropic" refer to a material that has different properties according to direction in the material. A magnetoresistance element can have a particular axis or direction to which the magnetization of a ferromagnetic or ferrimagnetic layer tends to orientate when it does not experience an additional, external, magnetic field. An axial anisotropy can be created by a crystalline effect or by a shape anisotropy, both of which can allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be parallel to (or, in some cases, perpendicular to) that anisotropy in the absence of an external field. In the case of a GMR or TMR element, a directional anisotropy provides an ability to obtain a coherent rotation of the magnetic field in a magnetic layer in response, for example, to an external magnetic field, which has the property of suppressing the hysteresis behavior of the corresponding element.

As described above, as used herein, the term "magnetic field sensing element" is used to describe a variety of different types of electronic elements that can sense a magnetic field. A magnetoresistance element is but one type of magnetic field sensing element.

As is known, there are different types of magnetoresistance elements, for example, a giant magnetoresistance (GMR) element and a tunneling magnetoresistance (TMR) element, also called a magnetic tunnel junction (MTJ) element.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the terms "substantially" and the term "about" reflect angles that are within manufacturing tolerances, for example, within +/−ten degrees.

Structures and methods described herein apply to both GMR and TMR magnetoresistance elements. However, it should be appreciated that the same or similar structures and methods can apply to other spin electronics magnetoresistance elements, either now known or later discovered. This includes, in particular, oxide based spin electronics structures.

Terms "single double pinned" and "dual double pinned" are used herein to describe two different arrangements of magnetoresistance elements. These terms become clear in conjunction with FIG. 11 below. However, let it suffice here to say that a dual double pinned magnetoresistance element is two single double pinned magnetoresistance elements, which can be stacked such that one is on top of the other. In contrast, a single double pinned magnetoresistance element is one double pinned magnetoresistance element.

Referring now to FIG. 1, a graph 100 has a horizontal axis with a scale in units of magnetic field in Oersteds (Oe) and a vertical axis with a scale in units of resistance in arbitrary units.

A curve 102 is representative of a resistance transfer function of a dual double pinned GMR element, i.e., resistance versus magnetic field experienced by the dual double pinned GMR element. The resistance transfer function 102 has a linear region 102a between an upper saturation point 102b and a lower saturation point 102c. Regions 102d, 102e are in saturation. It should be understood that the linear region 102a is not a perfectly straight line linear region.

A dual double pinned magnetoresistance element tends to have the resistance transfer function 102 that is symmetrical around zero magnetic field, while a single double pinned magnetoresistance element tends to have a shape similar to the resistance transfer function 102, but offset from zero magnetic field, particularly when reference and bias directions are not precisely orthogonal to each other.

It should be understood that a slope at a point on the resistance transfer function 102 is equivalent to a sensitivity (e.g., ohms per Oersted) of the illustrative dual double pinned GMR element at that point (i.e., at a particular external magnetic field).

It should be apparent that an actual single double pinned or dual double pinned GMR or TMR element has a linear region that is not a perfect straight line. Thus, it is desirable to have a determination of a linear region as described more fully below.

Figure 2:
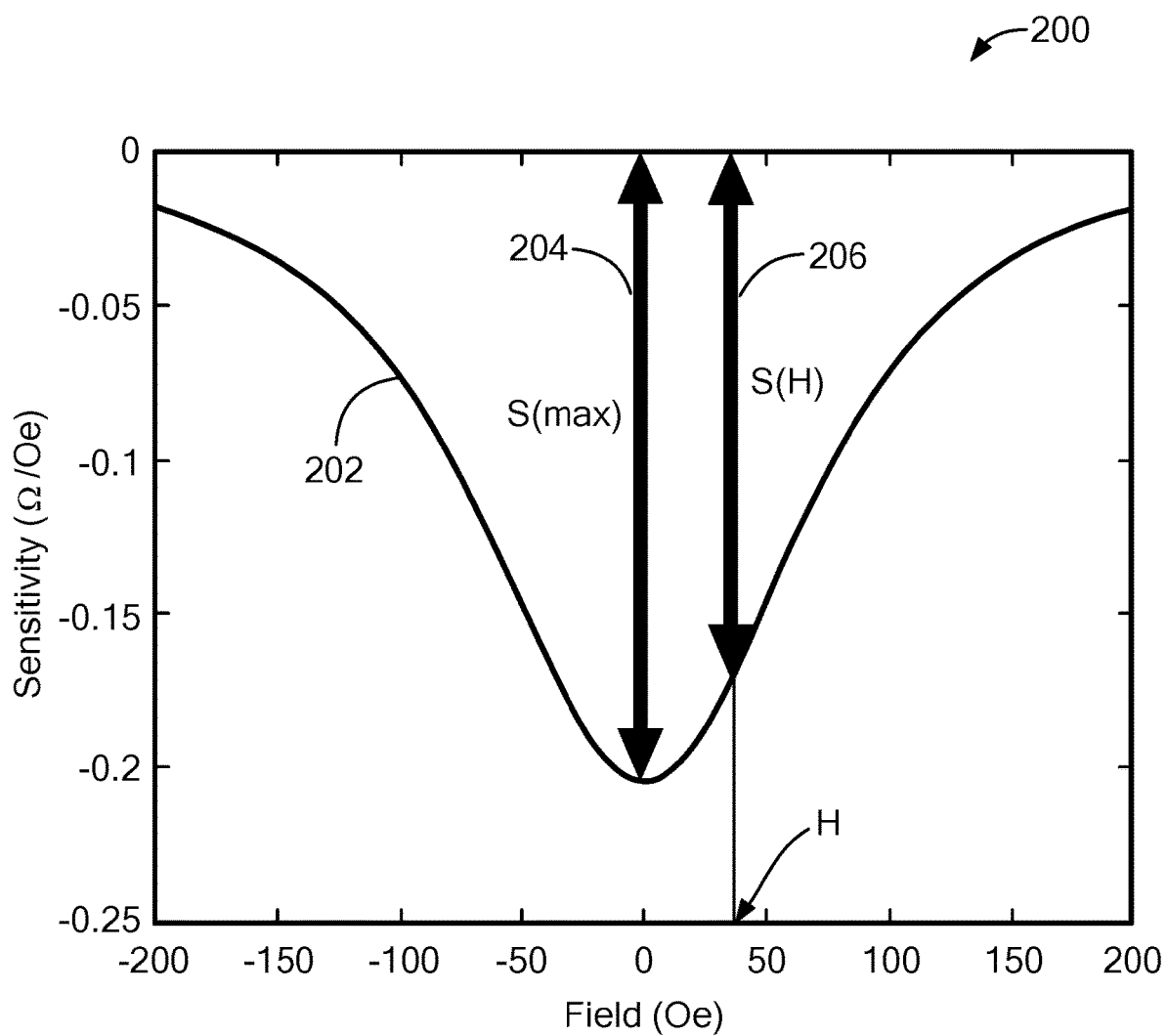
FIG. 2 is a graph showing sensitivity transfer function for a dual double pinned magnetoresistance element, for example, a dual double pinned GMR element.

Referring now to FIG. 2, a graph 200 has a vertical axis with a scale in units of sensitivity (i.e., slope of a resistance transfer function, e.g., curve 102 of FIG. 1), in ohms per Oersted, and a horizontal axis with a scale in units of magnetic field in Oersteds.

A curve 202 is representative of a sensitivity transfer function of an illustrative dual double pinned GMR element versus magnetic field (dual double pinned characterized by symmetry about zero magnetic field). The illustrative dual double pinned GMR element has a maximum sensitivity S(max) of about −0.2 Ohms per Oersted represented by an arrow 204. At a magnetic field of about 40 Oersteds, the illustrative dual double pinned GMR element has a sensitivity S(H) of about −0.16 Ohms per Oersted represented by an arrow 206.

Figure 3:
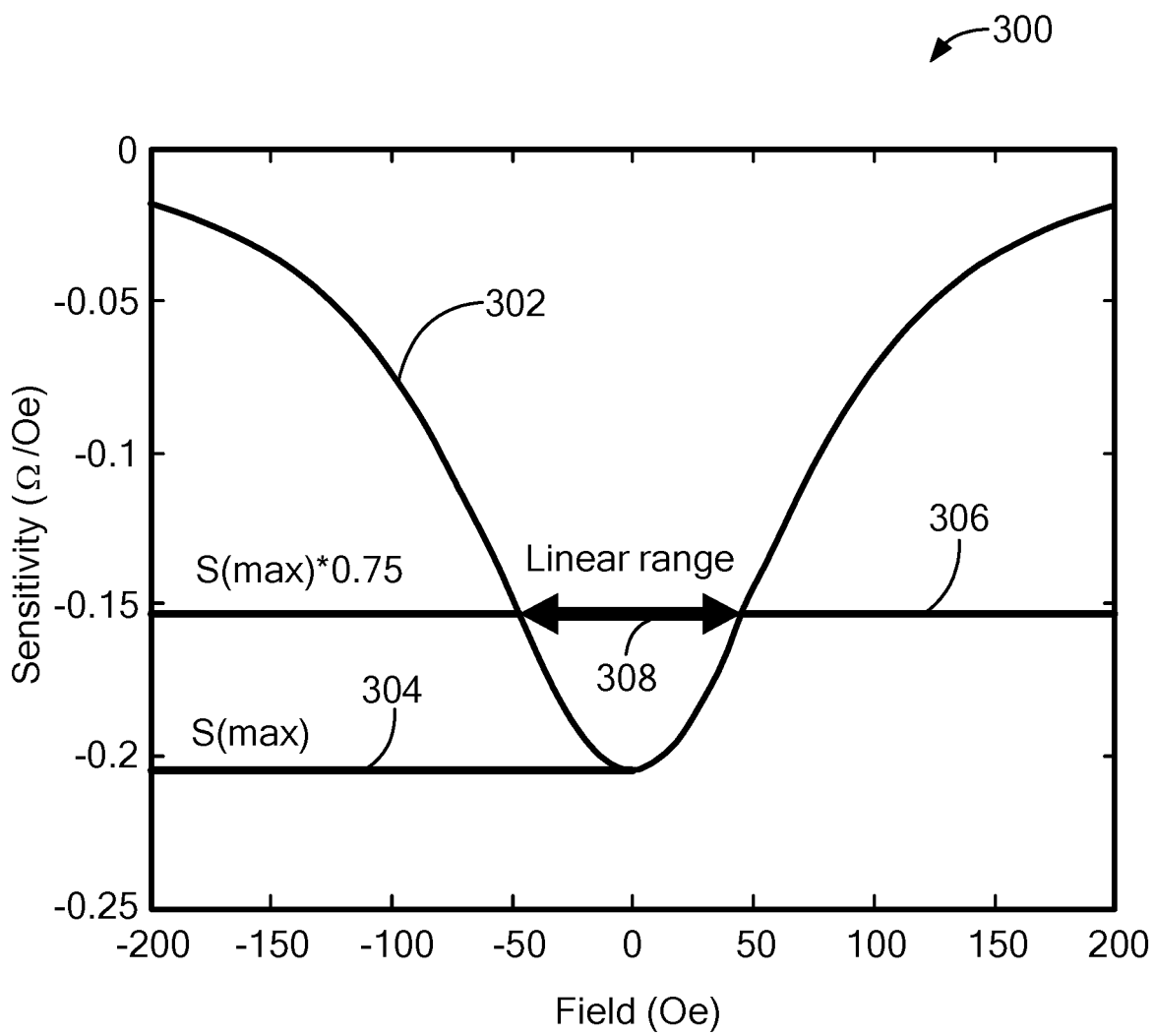
FIG. 3 is another graph showing sensitivity transfer function for a dual double pinned magnetoresistance element, for example, a dual double pinned GMR element.

Referring now to FIG. 3, a graph 300 has a vertical axis with a scale in units of sensitivity (i.e., slope of a resistance transfer function), in ohms per Oersted, and a horizontal axis with a scale in units of magnetic field in Oersteds.

A curve 302 is representative of a sensitivity transfer function of an illustrative dual double pinned GMR element versus magnetic field (dual double pinned characterized by symmetry about zero magnetic field). The illustrative dual double pinned GMR element has a maximum sensitivity S(max) of about −0.2 Ohms per Oersted represented by an arrow 304. At a magnetic field of about 40 Oersteds, the illustrative dual double pinned GMR element has a sensitivity S(H) of about −0.16 Ohms per Oersted represented by an arrow 306. Thus, the sensitivity (slope of the transfer curve 102 of FIG. 1) is different at different external magnetic fields and a resistance transfer function (e.g., 102 of FIG. 1) is not actually a straight line.

One way to express the nonlinearity is by the line 308 which shows a drop in sensitivity to about 75% of the maximum sensitivity S(max), which is represented by a line 304. Thus, the line 308 is indicative of external fields of about +/−fifty Oersteds at which the sensitivity is about 75% of the maximum sensitivity.

This type of representation is used below to describe linearity and linearity enhancements.

Figure 4:
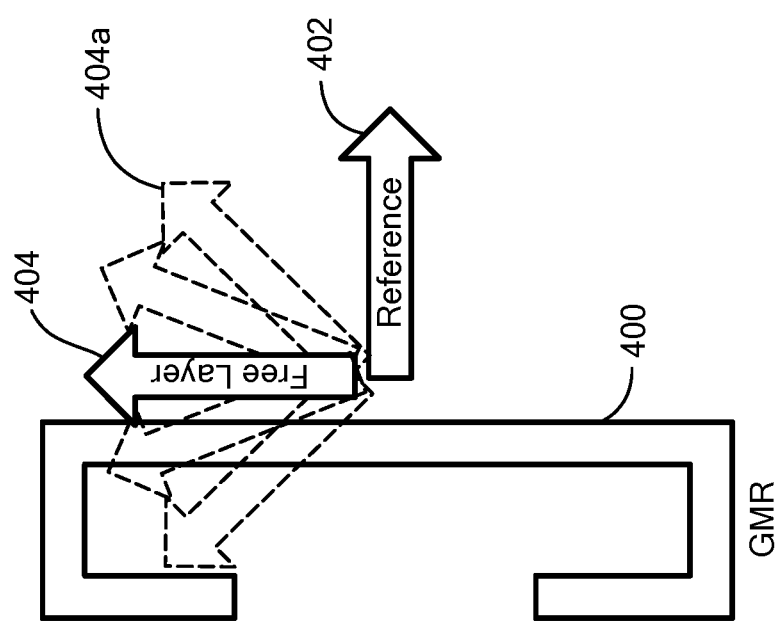
FIG. 4 is pictorial of a single double pinned GMR element formed in a yoke shape, and showing magnetic directions of reference layers and bias layers.

Referring now to FIG. 4, an illustrative single double pinned GMR element 400, from a top view, can have a so-called yoke shape to provide shape anisotropy. Different layers of an illustrative single double pinned GMR or TMR element (layers stacked out of the page) are described more fully below in conjunction with FIG. 11. However, let it suffice here to say that a single double pinned GMR and TMR element can include so-called "reference layers," "bias layers," and "free layers." In some embodiments, there can be one group of free layers or more than one group of free layers.

During manufacture of a single double pinned magnetoresistance element, the reference layers and the bias layers can be annealed to take on magnetic directions different from each other, for example, at a relative angle of fifty degrees. When not experiencing an external magnetic field, generally the free layers take on a magnetic direction of the bias layers when ferromagnetically coupled. In contrast, generally the free layers take on a magnetic direction one hundred eighty degrees opposed to a direction of the bias layers when antiferromagnetically coupled. Ferromagnetic or antiferromagnetic coupling to the free layers is determined according to material and thickness of a nonmagnetic spacer layer between the bias layers and the free layers. When exposed to an external magnetic field, it is rotations and/or changes of amplitude of the magnetic fields of the free layers that causes the magnetoresistance element to change resistance in response to the external magnetic field.

Thus, the illustrative single double pinned GMR element 400 can include a reference layer that is magnetized by annealing during manufacture to generate a magnetic field with a reference magnetic field direction 402 that can be perpendicular to a long side of the yoke shape Bias layers can be magnetized by annealing during manufacture to generate a magnetic field with a bias magnetic field direction in one selected direction, for examples, fifty degrees relative to the long side of the yoke. In the absence of a magnetic field, free layers can have one magnetic direction parallel to the magnetic direction of the bias layers. The free layer direction can be represented by one of a plurality of arrows, e.g., 404, 404a, each of which has a different direction than the reference magnetic direction 402. As described above, free layers can be ferromagnetically or antiferromagnetically coupled to the bias layers.

Electrical current in the single double pinned magnetoresistance element 400 of FIG. 4 can flow in the direction of the one or more free layers, i.e., parallel to the page, which would be parallel to a surface of a substrate on which the GMR element is formed. However, some GMR elements use a current that flows perpendicular to the surface of the substrate.

It has been determined that the relative directions between the reference magnetic direction 402 and a bias layer direction, i.e., directions 404, 404a, of the free layers (parallel to the bias layers) in the absence of an external magnetic field, can influence a range of the linearity of resistance and sensitivity transfer functions of the single double pinned magnetoresistance element. Illustrative behaviors of the single double pinned magnetoresistance element are described below in conjunction with FIGS. 12-15.

Figure 5:
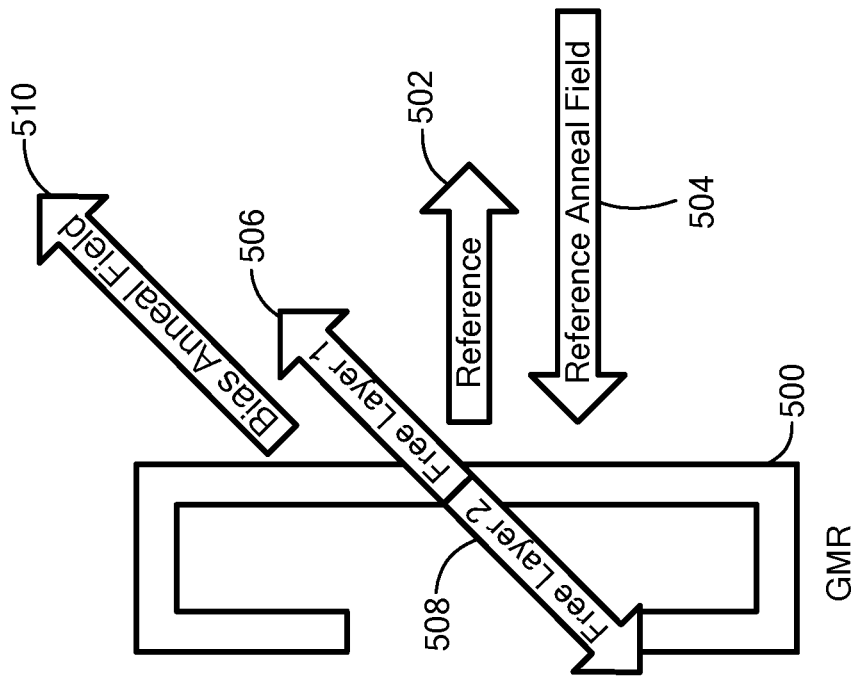
FIG. 5 is pictorial of a dual double pinned GMR element formed in a yoke shape, having two double pinnings, and showing magnetic directions of reference layers and two sets of bias layers.

Referring now to FIG. 5, an illustrative dual double pinned GMR element 500 can include a reference layer that is magnetized by annealing with a reference annealing field 504 during manufacture to generate a magnetic field with a reference magnetic direction 502 (shown for antiferromagnetic coupling within a synthetic antiferromagnet (SAF) pinned layer structure, see, e.g., SAFs in FIG. 11) that can be perpendicular to a long side of the yoke shape. Bias layers can be magnetized by annealing with a bias magnetic field during manufacture to generate a magnetic field with a bias magnetic direction 510. As described above, free layers can be ferromagnetically or antiferromagnetically coupled to the bias layers with magnetic bias direction 510, resulting in the two opposite directions 506, 508 of the free layers in the absence of an external magnetic field.

As shown, there can be two sets of free layers (see, e.g., FIG. 11) parallel to the bias layer annealing field 510 but with magnetic directions in two opposing directions represented by arrows 508, 508. Reasons for the two opposing directions are described below in conjunction with FIG. 11. However, let it suffice here to say that the two opposing directions result in the magnetoresistance element 500 having a resistance and sensitivity transfer function with an improved symmetry about zero magnetic field.

It has been determined that the relative directions between the reference direction 504 and the bias direction 510, i.e., directions 506, 508 free layer magnetic direction of the two sets of free layers of the dual double pinned magnetoresistance element in the absence of an external magnetic field, can influence a range of the linearity of resistance and sensitivity transfer functions of the dual double pinned magnetoresistance element. Illustrative enhancements of the dual double pinned magnetoresistance element are described below in conjunction with FIGS. 9 and 10.

Figure 6:
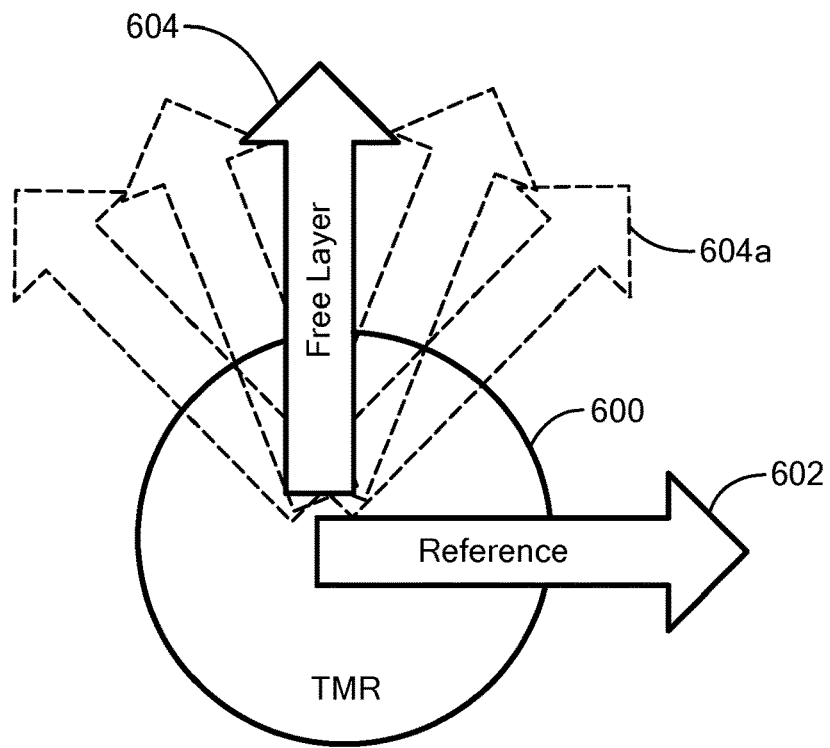
FIG. 6 is pictorial of a single double pinned TMR pillar showing magnetic directions of reference layers and bias layers.
Figure 7:
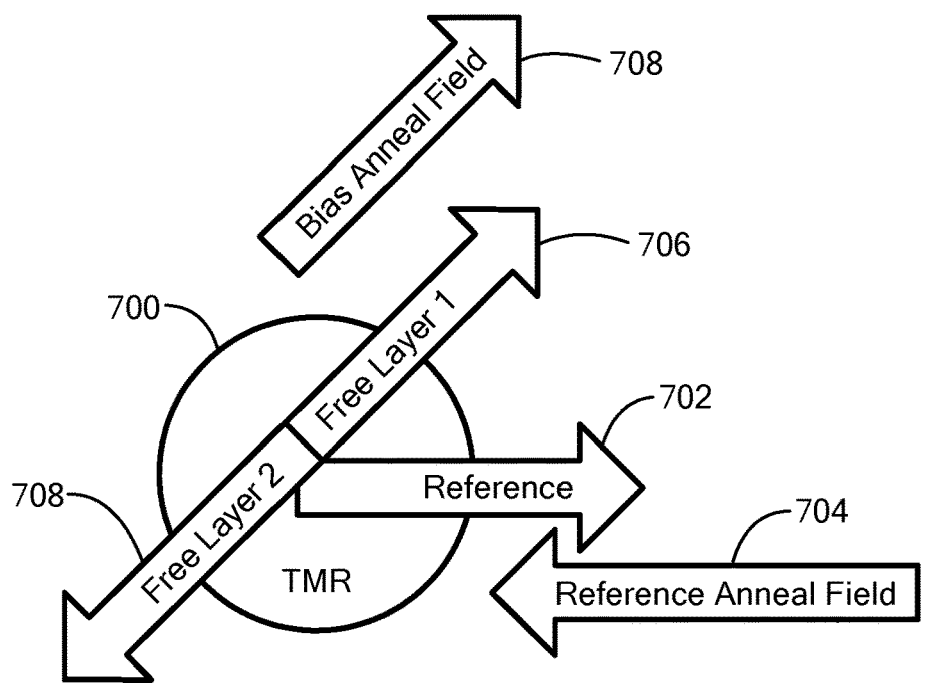
FIG. 7 is pictorial of a dual double pinned TMR pillar having two double pinnings and showing magnetic directions of reference layers and two sets of bias layers.

Referring now to FIGS. 6 and 7, TMR elements 600, 700 show similar concepts as the GMR elements 400, 500, but applied to one pillar of a TMR element.

Generally, a TMR element has a plurality of such pillars electrically arranged in parallel or in series, or in a parallel/series combination. Electrical current in a TMR element flows generally in a direction perpendicular to the page, which would be perpendicular to a surface of a substrate on which the TMR element is formed.

Reference magnetic directions 602, 702, and free layer magnetic directions, e.g., 604, 604a, 706, 708 in the absence of a magnetic field should be understood from discussion above in conjunction with FIGS. 4 and 5.

A reference layer annealing field 704 and a bias layer (and free layer) annealing field 708 will be understood from discussion above in conjunction with FIG. 5.

Figure 8:
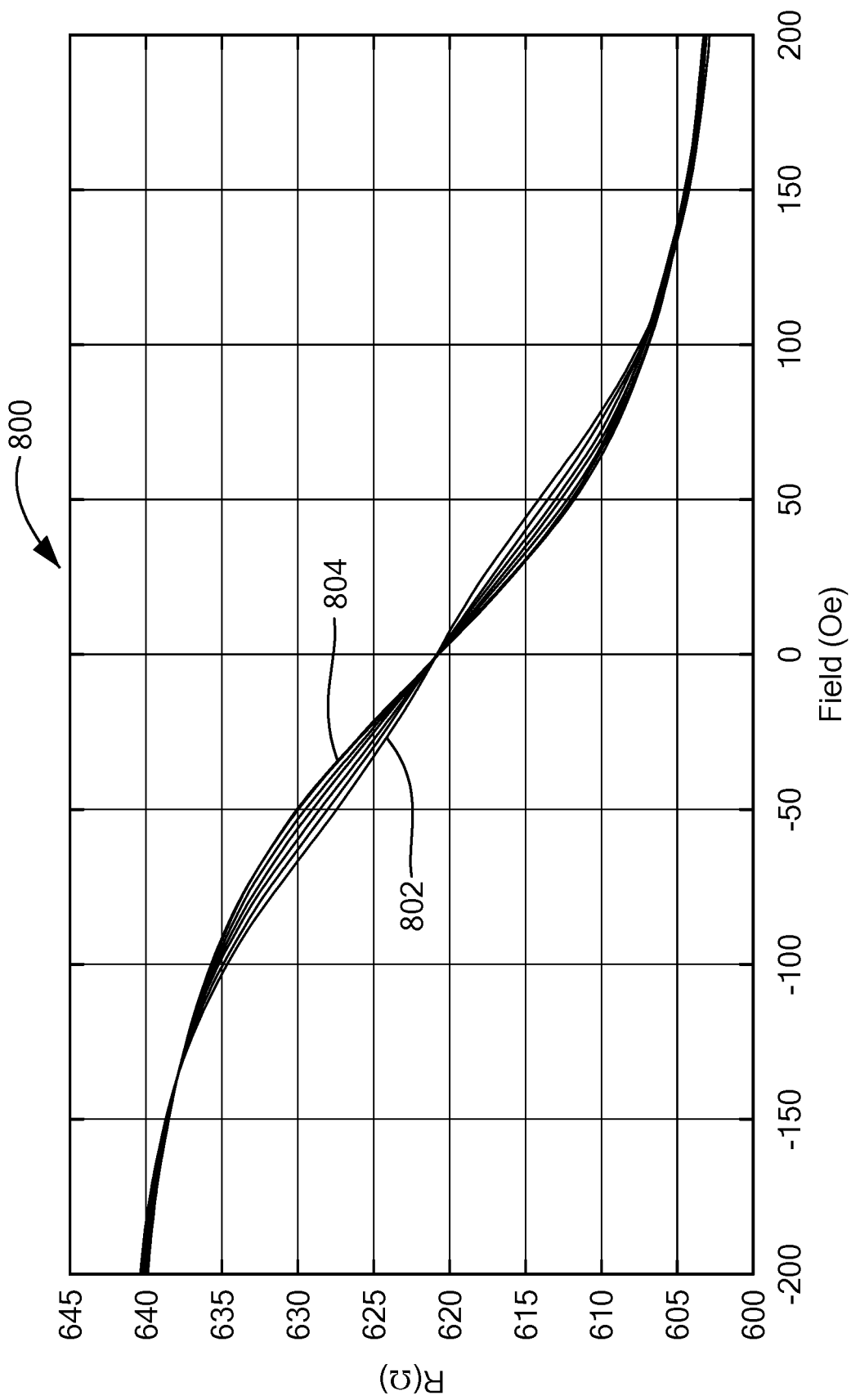
FIG. 8 is a graph showing predicted resistance transfer functions of a dual double pinned magnetoresistance element, for example, a dual double pinned GMR element, for different relative magnetic directions between magnetic field directions of reference layers and bias layers.

Referring now to FIG. 8, a graph 800 has a vertical axis with a scale in resistance in units of ohms and a horizontal axis with a scale in units of magnetic field, along reference layer magnetic direction 502 in Oersteds, i.e., along a maximum response axis of the dual double pinned GMR magnetoresistance elements 500 of FIG. 5.

A curve 802 is indicative of a resistance transfer function associated with a simulated dual double pinned GMR element, like the dual double pinned GMR element 500, for a relative angle of fifty or one hundred thirty degrees between the reference magnetic direction 504 and the bias direction 510, i.e., a first free layer direction 506 in the absence of an external magnetic field. A curve 804 is indicative of a resistance transfer function for a relative angle of ninety thirty degrees. Other curves are associated with angles between fifty and one hundred thirty degrees. A similar resistance transfer function of a dual double pinned GMR element is described above in conjunction with FIG. 1.

It should be understood that a slope at a point on any of the resistance transfer function curves 802, 804 is equivalent to a sensitivity (e.g., ohms per Oersted) of the simulated dual double pinned GMR element at that point (i.e., at a particular external magnetic field).

The group of curves, e.g., 802, 804, show different amounts of linearity depending upon a relative angle between a direction 502 of the reference magnetic field and selected ones of the directions, e.g. 506, 508, from a plurality of such directions of potential bias layer magnetic fields.

Figure 9:
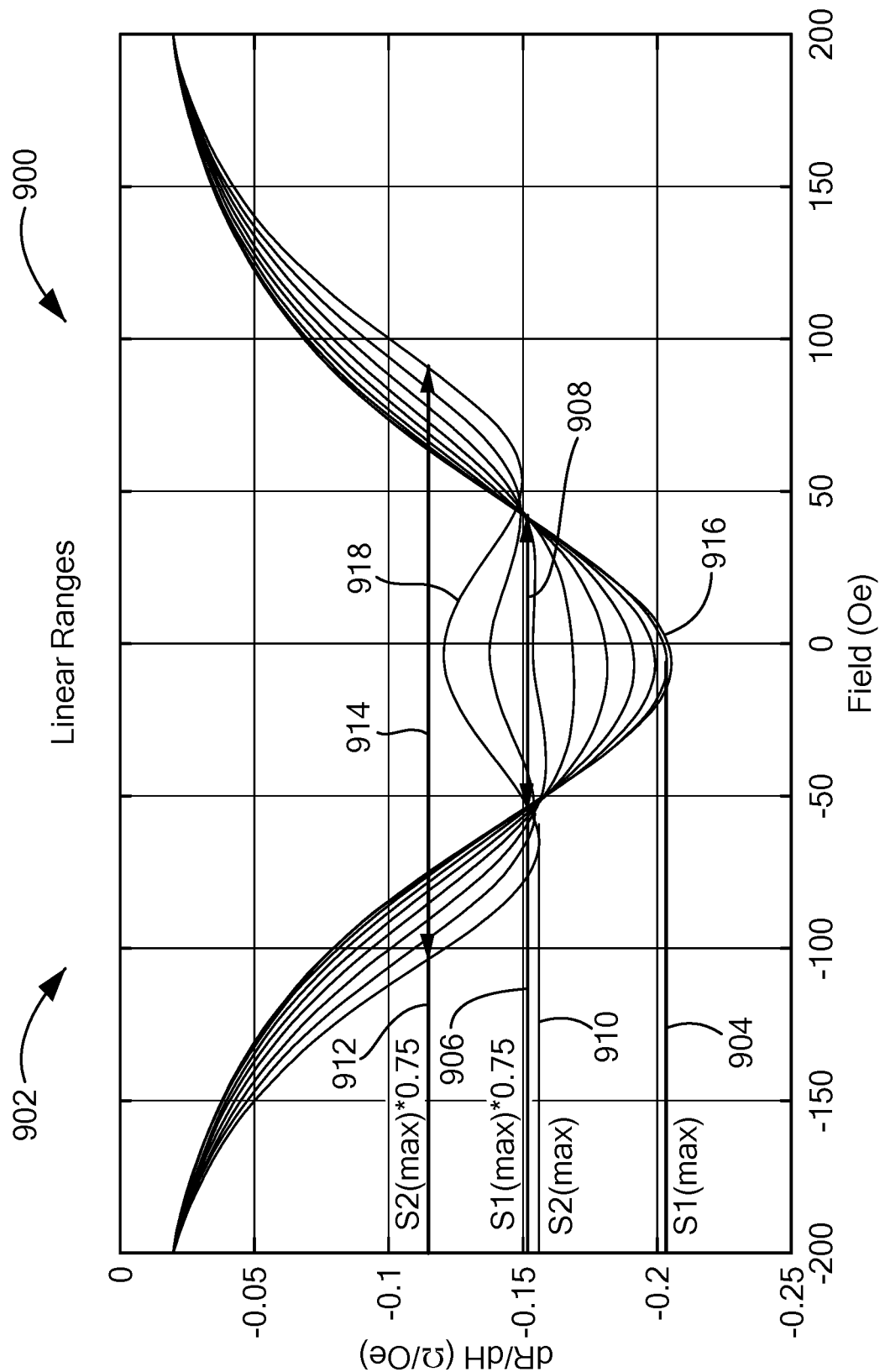
FIG. 9 is a graph showing sensitivity transfer functions of a dual double pinned magnetoresistance element, for example, a dual double pinned GMR element, for different relative magnetic directions between magnetic field directions of reference layers and bias layers.

Referring now to FIG. 9, with reference to FIGS. 2 and 3, a graph 900 has a vertical axis with a scale in units of sensitivity (i.e., slope of a transfer function, e.g., curves 802 of FIG. 8), in ohms per Oersted, and a horizontal axis with a scale in units of magnetic field along the reference layer magnetic direction 502 in Oersteds.

A group of curves 902 show sensitivity transfer functions associated with a simulated dual double pinned GMR element, which can be similar to behavior of a dual double pinned TMR element.

A curve 916 is indicative of a ninety degrees relative angle between the reference magnetic direction 504 and the bias magnetic direction 510 of FIG. 5. The curve 916 has a maximum sensitivity 904, S1(max). A linear range 908 of about +ninety Oersteds is derived as S1(max)*0.75, indicated by a line 908.

A curve 918 is indicative of a fifty degrees relative angle between the reference magnetic direction 504 and the bias magnetic direction 510 of FIG. 5. The curve 918 has a maximum sensitivity 910, S2(max). A linear range 914 of about one hundred ninety Oersteds is derived as S2(max) *0.75, indicated by a line 906. This is an improvement of about one hundred ten percent.

A maximum linear range 914 occurs at the relative angle of about fifty degrees for this particular simulation. Other simulations, for example, using a yoke (see FIG. 5) having a different geometry, can result in different improvement of linear range, and a different relative angle at which a greatest improvement occurs.

Note from FIG. 9 that there may be a loss of maximum sensitivity at relative angles other than ninety degrees. Thus, there may be a tradeoff between linearity and sensitivity, and other relative angles may be desired.

Ranges of relative angles of the first free layer 506 of FIG. 5 in the absence of an external magnetic field can be in a range of fifty to one hundred thirty degrees, relative to the reference direction 504. In some embodiments, the relative angle can be in a range between fifty degrees and eighty-five degrees, or in a range between ninety-five degrees and one hundred thirty.

The magnetic direction 508 of the second free layer in the absence of an external magnetic field can be parallel to but opposite to the magnetic direction 506, and thus, can be in a range of minus one hundred thirty to minus fifty degrees. In some embodiments, the relative angle can be in a range between minus one hundred thirty degrees and minus ninety-five degrees, or in a range between minus eighty-five and minus fifty degrees.

Preferred relative angles of the first free layer in the absence of an external magnetic field can be fifty degrees, sixty degrees, seventy degrees, eighty degrees, ninety degrees, one hundred degrees, one hundred ten degrees, one hundred twenty degrees, or one hundred thirty degrees. The magnetic direction 508 of the second free layer can be parallel to but opposite to the magnetic direction 506 of the first free layer.

Figure 10:
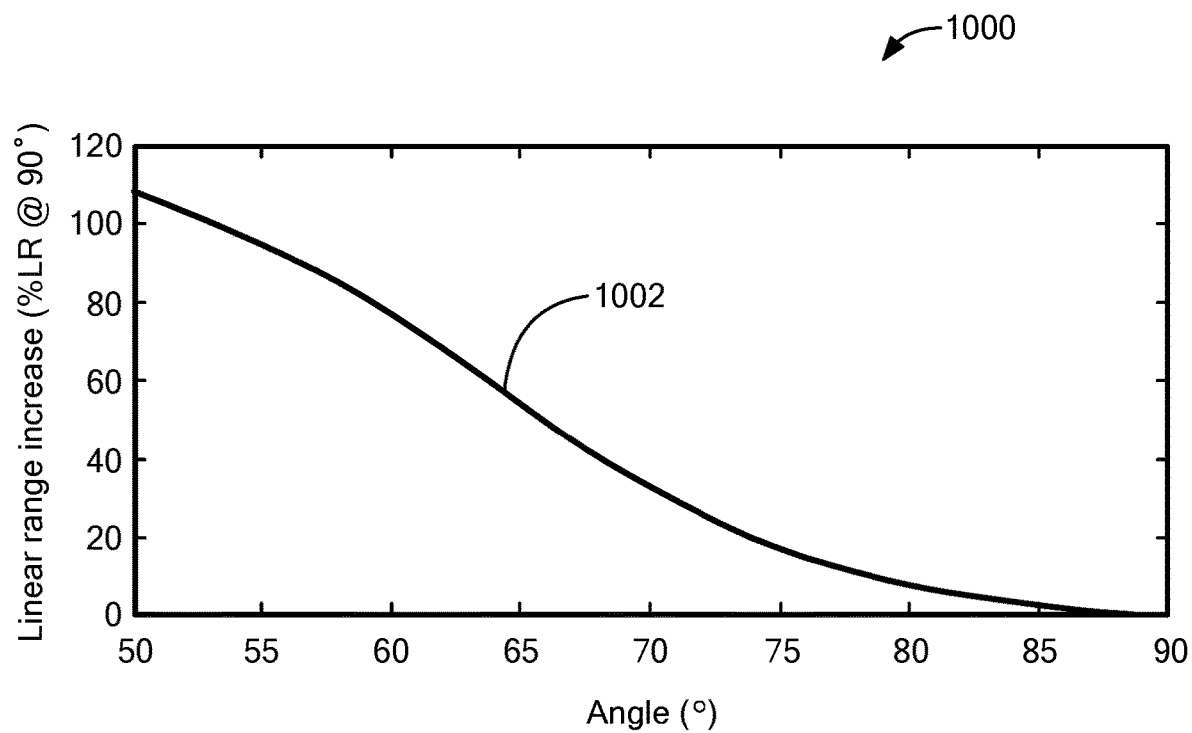
FIG. 10 is a graph showing an increase of linear range of a dual double pinned magnetoresistance element, for example, a dual double pinned GMR element, versus different relative magnetic directions between magnetic field directions of reference layers and bias layers.

Referring now to FIG. 10, a graph 1000 has a vertical axis with a scale in units of percentage increase in linear range relative to a linear range at a relative angle of ninety degrees between the reference magnetic direction 502 and a plurality of free layer magnetic directions, e.g., 506, 508 of FIG. 5. The graph 1000 also has a horizontal axis with a scale in units of angle, i.e., the relative angle described above.

A greatest linear range improvement occurs at a relative angle of about fifty degrees, which is similar to that shown in FIG. 9.

Referring now to FIG. 11, an illustrative dual double pinned GMR element 1100 can have a plurality of layers 1102-1142 arranged in a stack of layers. In some embodiments, the plurality of layers can be formed by sputtering or by vapor deposition over a semiconductor substrate.

Some aspects of a dual double pinned GMR element similar to the dual double pinned GMR element 1100 are described in U.S. Pat. No. 9,812,637, issued on Nov. 7, 2017 and entitled "Spin Valve Magnetoresistance Element With Improved Response to Magnetic Fields." U.S. Pat. No. 9,812,637 is incorporated by reference herein in its entirety. Unlike the dual double pinned GMR element of U.S. Pat. No. 9,812,637, the dual double pinned GMR element 1100 can have layers with relative magnetic directions indicated in figures above and different than the above patent. The stack of layers 1102-1142 is also different. However, it should be understood that, in other embodiments, the stack of layers of the magnetoresistance element 1100 can be different and it is the relative magnetic directions of reference layers and bias layers (and associated free layers) described above that can achieve the desired result of increased linear range.

The dual double pinned GMR element 1100 can be considered as two single double pinned GMR elements 1144, 1146 stacked upon each other in either order, and which share the pinning layer 1122. It should be recognized that the two single double pinned GMR elements 1144, 1146 have layer stacks that are in a reverse order from each other. The dual double pinned GMR element 1100 is also used to represent a single double pinned magnetic field element, which can be like the single double pinned magnetoresistance element 1144 or 1146 without layers above or below, respectively, but with the cap layer 1142.

The two single double pinned GMR elements 1144, 1146 can be used for a particular purpose. Namely, and referring to the GMR resistance transfer function of FIG. 1, the two single double pinned magnetoresistance elements 1144, 1146 can have opposite directions of offsets in respective transfer functions such that the transfer functions of the single double pinned magnetoresistance elements 1144, 1146 are not symmetrical about zero magnetic field and are offset in different directions, one offset to the right and one to the left. The two different directions of offsets in the dual double pinned magnetoresistance element 1100, taken together, result in an overall transfer function that is centered and symmetrical about zero magnetic field.

It is also possible to provide two separate (not in one stack of layers) single double pinned GMR elements like the single double pinned GMR elements 1144, 1146, with appropriate seed and cap layers, but coupled together electrically. However, separate single double pinned GMR elements coupled together may be more difficult to fabricate then the two stacked together single double pinned GMR elements 1144, 1146.

Coupling of two or more single double pinned magnetoresistance elements is described more fully below in conjunction with FIGS. 12-15.

The dual double pinned GMR element 1100 can include first reference layers 1152 and second reference layers 1154. The first reference layers 1152 can include the pinning layer 1104 and pinned layers 1106, 1108, 1110. The second reference layers 1154 can include the pinning layer 1140 and the pinned layers 1134, 1136, 1138. The pinned layers 1134, 1136, 1138 form a so-called synthetic antiferromagnet (SAF). The pinned layers 1104, 1106, 1108 also form a synthetic antiferromagnet (SAF).

The first reference layers 1152 and the second reference layers 1154 can be annealed in a first an annealing manufacturing step to have a first magnetic direction. The first magnetic direction can be that which is represented, for example, by reference direction arrow 502 in FIG. 5.

The dual double pinned GMR element 1100 can include first bias layers 1148 and second bias layers 1150. The first bias layers 1148 can include the pinning layer 1122, the pinned layer 1120, and the spacer layer 1118. Thus, the pinning layer 1122 can be shared. The second bias layers 1150 can include the pinning layer 1122, the pinned layer 1124, and the spacer layer 1126.

The first bias layers 1148 and the second bias layers 1150 can be annealed in a second annealing manufacturing step to have a second magnetic direction different than the first magnetic direction. The second magnetic direction can be that which is represented, for example, by arrow 506 of FIG. 5, which is indicative of a ferromagnetic coupling between the bias layers 1148 and the free layers 1114, 1116.

A type of coupling to the first and second free layer structures 1114, 1116, and 1128, 1130, respectively, i.e., ferromagnetic or antiferromagnetic coupling, can be controlled by thicknesses of the spacer layers 1118 and 1126, respectively. Here, the spacer layer 1126 is thinner than the spacer layer 1118, and thus, coupling between the second bias layers 1150 and the second free layers 1128, 1130 can be antiferromagnetic and coupling between the first bias layers 1148 and the free layers 1114, 1116 can be ferromagnetic, i.e., they can be in opposite directions. The ferromagnetic coupling is represented as arrow 506 of FIG. 5 and the antiferromagnetic coupling is represented as arrow 508 of FIG. 5.

In view of the above, it should be recognized that the first free layers 1114, 1116 experience a first bias field with a first bias direction generated by the first bias layers 1148, and, in the absence of an external magnetic field, the first free layers 1114, 1116 tend to take on a first free layer field direction of the first bias layers 1148. The second free layers 1128, 1130 experience a second bias field with a second bias direction generated by the second bias layers 1150, and, in the absence of an external magnetic field, the second free layers 1128, 1130 tend to take on a second free layer field direction of the second bias layers 1150.

The opposite coupling directions is also an aspect that tends to result in the dual double pinned GMR element 1100 having a transfer function that is symmetrical about zero magnetic field.

As is known, annealing of layers of a magnetoresistance element is accomplished by way of exposing the magnetoresistance element to a magnetic field having a particular direction and having a particular field strength at a particular temperature for a particular time. The first and second annealing manufacturing steps can have different temperatures, and/or different magnetic field strengths, and/or different time durations.

While the illustrative dual double pinned GMR element 1100 is shown having layers with particular materials and thicknesses, it will be understood that another dual double pinned GMR element or a TMR element can have layers made of different materials with different thicknesses. For example, to form a dual double pinned TMR element, the Cu spacer layers 1112, 1132 can be changed to MgO tunneling barrier layers.

Unlike graphs 800, 900, 1000 of FIGS. 8-10, which show behaviors of a dual double pinned magnetoresistance element, e.g., 1100 of FIG. 1, FIGS. 12-15 show behaviors of a single double pinned magnetoresistance element, e.g., 1144 or 1146 of FIG. 11.

Figure 12:
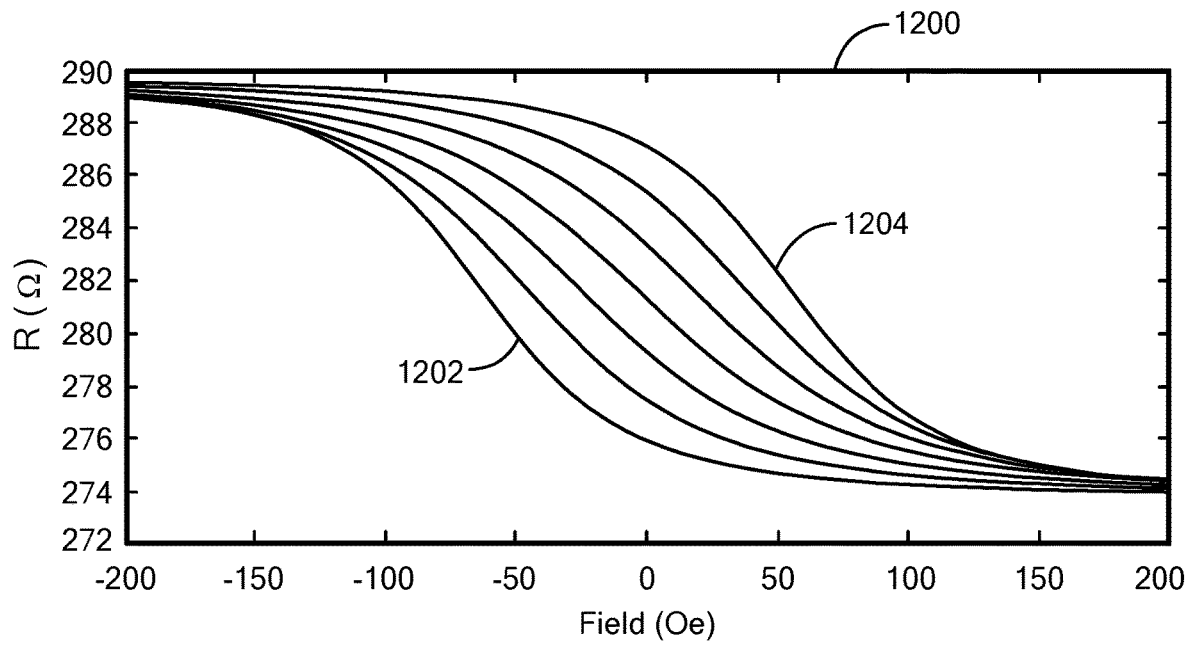
FIG. 12 is a graph showing predicted resistance transfer functions of a single double pinned magnetoresistance element, for example, a single double pinned GMR element, for different relative magnetic directions between magnetic field directions of reference layers and bias layers.

Referring now to FIG. 12, a graph 1200 has a horizontal axis with a scale in units of magnetic field in Oersteds (Oe) and a vertical axis with a scale in units of resistance in Ohms.

A curve 1202 is indicative of a resistance transfer function for single double pinned magnetoresistance element with a relative angle of forty-five degrees between a direction of a reference layer magnetic field and a direction of a bias layer magnetic field, i.e., a direction of a free layer magnetic field when in the presence of no external magnetic field. A curve 1204 is indicative of a resistance transfer function for a single double pinned magnetoresistance element with a relative angle of one hundred thirty-five degrees. Other curves are indicative of angles between forty-five and one hundred thirty-five degrees.

As described above, the relative angle influences not only a linear range but also an offset from zero magnetic field of a signal double pinned magnetoresistance element.

Figure 13:
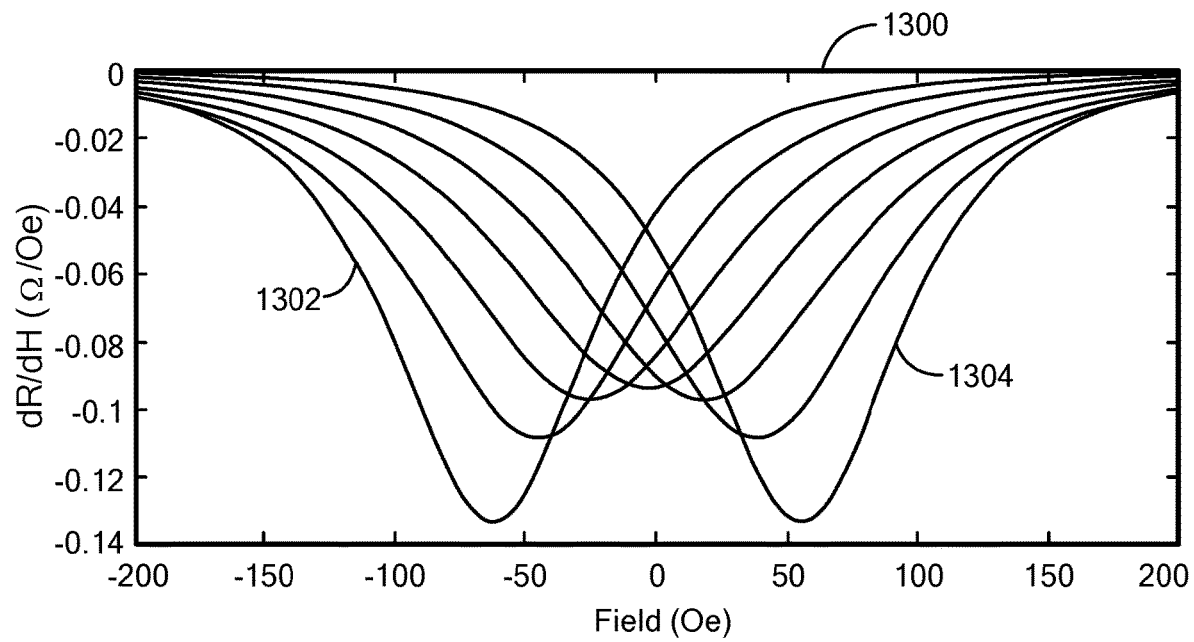
FIG. 13 is a graph showing sensitivity transfer functions of a single double pinned magnetoresistance element, for example, a single double pinned GMR element, for different relative magnetic directions between magnetic field directions of reference layers and bias layers.

Referring now to FIG. 13, a graph 1300 has a vertical axis with a scale in units of sensitivity (i.e., slope of a transfer function, e.g., curves of graph 1202, 1204 of FIG. 12), in ohms per Oersted, and a horizontal axis with a scale in units of magnetic field in Oersteds.

A curve 1302 is indicative of a sensitivity transfer function for single double pinned magnetoresistance element with a relative angle of forty-five degrees between a direction of a reference layer magnetic field and a direction of a bias layer magnetic field, i.e., a direction of a free layer magnetic field, when in the presence of no external magnetic field. A curve 1204 is indicative of a sensitivity transfer function for a single double pinned magnetoresistance element with a relative angle of one hundred thirty-five degrees. Other curves are indicative of angles between forty-five and one hundred thirty-five degrees.

Figure 14:
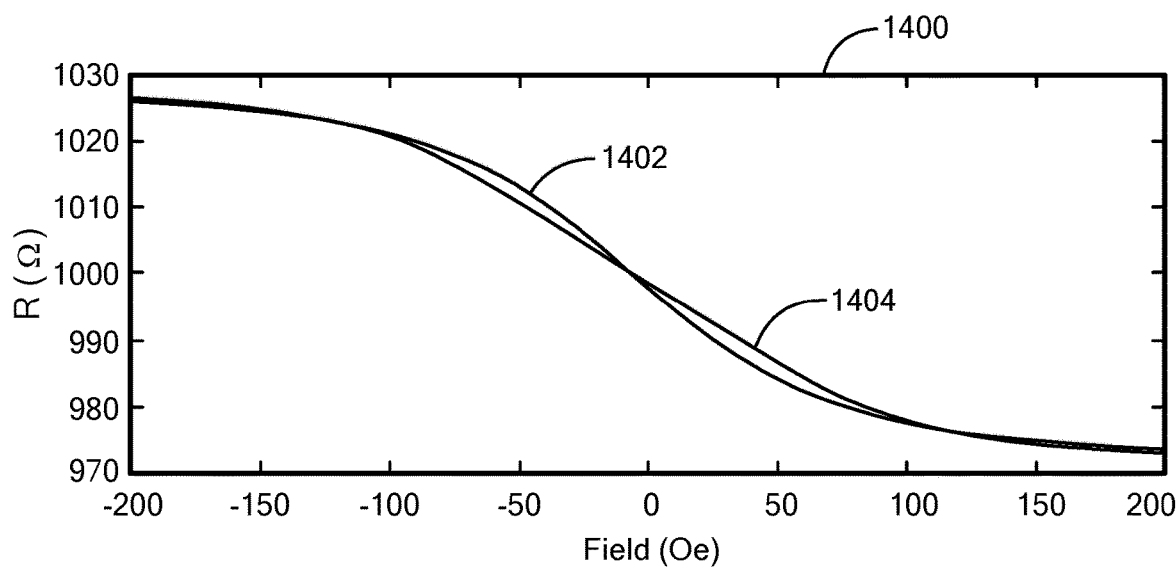
FIG. 14 is a graph showing a sum of predicted resistance transfer functions of three single double pinned magnetoresistance elements, for example, single double pinned GMR elements, each with a different relative magnetic direction between magnetic field directions of reference layers and bias layers.

Referring now to FIG. 14, a graph 1400 has a horizontal axis with a scale in units of magnetic field in Oersteds (Oe) and a vertical axis with a scale in units of resistance in Ohms.

A curve 1402 is indicative of a resistance transfer function for a single double pinned magnetoresistance element with a relative angle of ninety degrees.

A curve 1404 is indicative of a resistance transfer function for three single double pinned magnetoresistance elements coupled together in series with relative angles of forty-five degrees, ninety degrees, and one hundred thirty-five degrees. Similar results can be obtained for a parallel combination.

Figure 15:
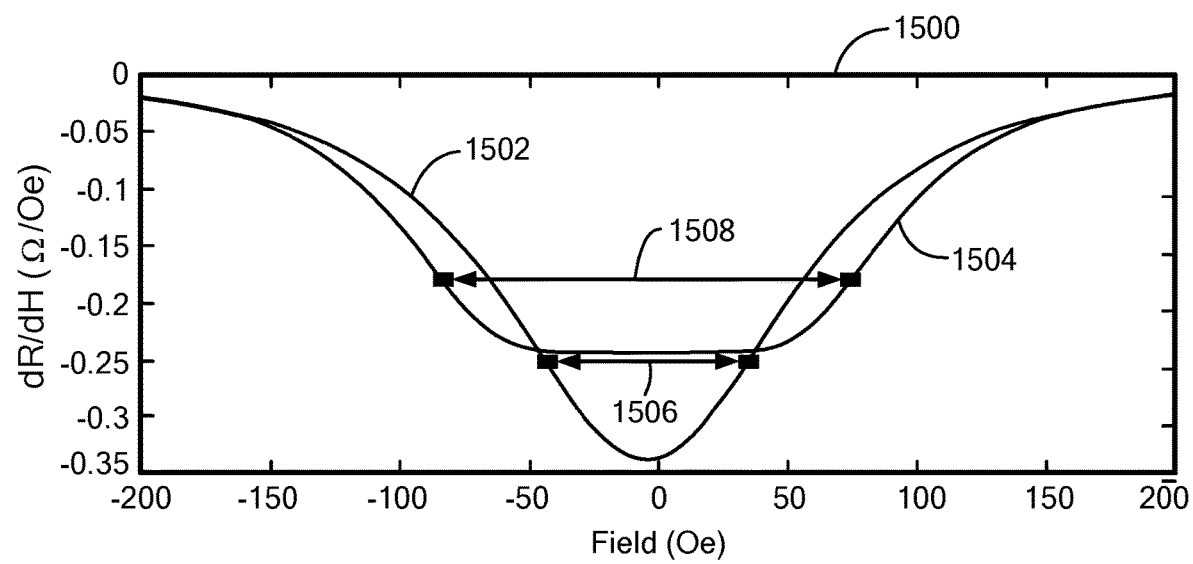
FIG. 15 is a graph showing a sum of sensitivity transfer functions of three single double pinned magnetoresistance elements, for example, single double pinned GMR element, each with a different relative magnetic direction between magnetic field directions of reference layers and bias layers.

Referring now to FIG. 15, a graph 1500 has a vertical axis with a scale in units of sensitivity (i.e., slope of a resistance transfer function, e.g., curves of graph 1402, 1404 of FIG. 14), in ohms per Oersted, and a horizontal axis with a scale in units of magnetic field in Oersteds.

A curve 1502 is indicative of a sensitivity transfer function for single double pinned magnetoresistance element with a relative angle of ninety degrees between a direction of a reference layer magnetic field and a direction of a bias layer magnetic field, i.e., a direction of a free layer magnetic field when in the presence of no external magnetic field. A curve 1504 is indicative of a sensitivity transfer function for three single double pinned magnetoresistance elements coupled together in series or in parallel with relative angles of forty-five degrees, ninety degrees, and one hundred thirty-five degrees.

The cure 1504 can be indicative of a linear range 1508 wider than a linear range 1506 of the curve 1502.

It is described above in conjunction with FIG. 11 showing the dual double pinning magnetoresistance element 1110, that first and second bias layers 1148, 1150 can generate first and second opposing bias directions by using two different thicknesses of spacer layers 1118, 1126. It will be recognized that it may be difficult to fabricate first and second single double pinned magnetoresistance elements on the same substrate with the different thicknesses of spacer layers. Thus, in order to achieve the opposing bias magnetic directions of first and second signal double pinned magnetoresistance elements, it may be desirable to reorient the bias (rebiasing) of one of the elements. Rebiasing can be achieved, for example, with local laser heating of only one of the elements, while exposing both elements to an annealing magnetic field.

Referring now to FIG. 16, an exemplary process 1600 for manufacturing a single or dual double pinned GMR element as in FIGS. 4 and 5 above, begins at block 1602, where the full stack, e.g., the stack 1100 of FIG. 11, is deposited in sequential deposition steps. This deposition can be followed at block 1604 by a patterning process. The patterning can result, for example, in the yoke shape of FIG. 4 or 5.

After the patterning of block 1604, a first annealing is applied at block 1606 to the processed wafer, where a direction, A, of the magnetic field in the reference layers (e.g., 1152, 1154 of FIG. 11) are defined After this first annealing of block 1606, at block 1608, a second annealing is performed to define the magnetization of the bias layers (e.g., 1148, 1150 of FIG. 11), which provides a magnetic field in the bias layers in a different direction, B, than the magnetic field in the reference layers.

Illustrative annealing parameters for the GMR element 1100 are shown in Table 1 below for the above described first and second annealing steps for the GMR element 1100 that has PtMn pinning layers 1104, 1122, 1140. In Table 1, the first annealing is for the reference layers 1152, 1154 and the second annealing is for the bias layers 1148, 1150.

TABLE 1

| Value | Typical | Approximate Range |
|---|---|---|
| First Annealing Step | | |
| T1 | 295° C. | 260° C. to 320° C. |
| H1 | 1 T | >0.3 T |
| Duration 1 | 1 Hour | 30 minutes to 2 hours |
| Field direction 1 | A | A |
| Second Annealing Step | | |
| T2 | 300° C. | 180° C. to 350° C. |
| H2 | 80 mT | 20 mT to 200 mT |
| Duration 2 | 1 Hour | 30 minutes to 5 hours |
| Field direction 2 | B | B |

Repining described above, if necessary, is not shown in Table 1, but will be understood.

Referring now to FIGS. 17 and 18, in which like elements of FIG. 16 are shown having like reference designations, similar processes 1700, 1800 can be also applied according to the steps of FIG. 16 but in different orders as shown.

In all of the processes 1600, 1700, 1800, the magnetic field H2 applied during the second annealing step (for bias layers) is smaller than H1 applied during the first annealing step (for reference layers), and applied in another direction. The other direction can result in a bias magnetic direction in the bias layers, e.g., layers 1148 and 1150 of FIG. 11, and free layer magnetic directions in the free layers 1114, 1116, 1128, 1130 magnetically coupled to the bias layers, which are substantially parallel to the magnetic field applied during the second annealing step. The other direction can be a relative angle, relative to the angle of the first annealing step. Relative angles and ranges of relative angles are described above in conjunction with FIG. 9.

Rebiasing, if necessary, is not showing in FIGS. 16-18. However, a rebiasing step can be inserted in any of these figures after the second annealing.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetoresistance element assembly, comprising:
a first stack of material layers disposed over a substrate, comprising:
first reference layers comprising a first reference magnetic direction;
first bias layers comprising a first bias magnetic direction; and
first free layers experiencing the first bias magnetic direction, wherein the magnetoresistance element assembly further comprises:
a second stack of material layers disposed over the substrate, comprising:
second reference layers comprising a second reference magnetic direction;
second bias layers comprising a second bias magnetic direction; and
second free layers experiencing the second bias magnetic direction,
wherein the first and second reference magnetic directions are parallel to each other, wherein a relative angle between the first reference magnetic direction and the first bias magnetic direction is between fifty and eighty-five degrees or between ninety-five and one hundred thirty degrees, wherein the second bias magnetic direction is parallel to and opposite to the first bias magnetic direction, and wherein the first bias magnetic direction and the second bias magnetic direction are each substantially parallel to a largest surface of the substrate.

2. The magnetoresistance element of claim 1, wherein the second stack of material layers is disposed over the first stack of material layers and the first stack of material layers is disposed over the substrate.

3. The magnetoresistance element of claim 1, wherein the second stack of material layers is disposed upon the substrate and the first stack of material layers is disposed upon the substrate to the side of the second stack of material layers.

4. The magnetoresistance element of claim 3, wherein the first and second stacks of material layers are electrically coupled in parallel or in series.

5. The magnetoresistance element of claim 1, wherein the first and second material stacks comprise respective GMR elements.

6. The magnetoresistance element of claim 1, wherein the first and second material stacks comprise respective yoke shapes, each with a longest dimension and a smallest dimension perpendicular to the longest dimension.

7. The magnetoresistance element of claim 6, wherein the first and second reference magnetic directions are substantially parallel to the smallest dimension.

8. The magnetoresistance element of claim 1, wherein the first and second material stacks comprise respective TMR elements.

9. The magnetoresistance element of claim 1, wherein the first reference magnetic direction and the second reference magnetic direction are each substantially parallel to the major surface of the substrate.

10. A method of forming a magnetoresistance element assembly, the method comprising:
   forming a first stack of material layers disposed over a substrate, comprising:
      first reference layers comprising a first reference magnetic direction;
      first bias layers comprising a first bias magnetic direction; and
      first free layers experiencing the first bias magnetic direction, wherein the method further comprises:
   forming a second stack of material layers disposed over the substrate, comprising:
      second reference layers comprising a second reference magnetic direction;
      second bias layers comprising a second bias magnetic direction; and
      second free layers experiencing the second bias magnetic direction,
   wherein the first and second reference magnetic directions are parallel to each other, wherein a relative angle between the first reference magnetic direction and the first bias magnetic direction is between fifty and eighty-five degrees or between ninety-five and one hundred thirty degrees, wherein the second bias magnetic direction is parallel to and opposite to the first bias magnetic direction, and wherein the first bias magnetic direction and the second bias magnetic direction are each substantially parallel to a largest surface of the substrate.

11. The method of claim 10, wherein the second stack of material layers is disposed over the first stack of material layers and the first stack of material layers is disposed upon the substrate.

12. The method of claim 11, further comprising:
   in a first annealing step, annealing the first and second stacks of material layers, resulting in the first and second reference layers having the first reference magnetic direction; and
   in a second annealing step, annealing the first and second stacks of material layers, resulting in the first bias layers having the first bias magnetic direction, and resulting in the second bias layers having the second bias magnetic direction.

13. The method of claim 10, wherein the second stack of material layers is disposed upon a substrate and the first stack of material layers is disposed upon the substrate to the side of the second stack of material layers.

14. The method of claim 13, wherein the first and second stacks of material layers are electrically coupled in parallel or in series.

15. The method of claim 14, further comprising:
   in a first annealing step, annealing the first and second stacks of material layers, resulting in the first and second reference layers having the first reference magnetic direction;
   in a second annealing step, annealing the first and second stacks of material layers, resulting in the first bias layers having the first bias magnetic direction, and resulting in the second bias layers having the first bias magnetic direction; and
   in a rebiasing step, rebiasing the second stack of material layers; resulting in the second bias layers having the second bias magnetic direction.

16. The method of claim 10, wherein the first and second material stacks each comprise a respective yoke shape with a longest dimension and a smallest dimension perpendicular to the longest dimension.

17. The method of claim 16, wherein the first and second reference magnetic directions are substantially parallel to the smallest dimension.

18. The method of claim 10, wherein the first reference magnetic direction and the second reference magnetic direction are each substantially parallel to the major surface of the substrate.

19. A magnetoresistance element assembly, comprising:
   means for forming a first stack of material layers disposed over a substrate, comprising:
      first reference layers comprising a first reference magnetic direction;
      first bias layers comprising a first bias magnetic direction; and
      first free layers experiencing the first bias magnetic direction, wherein the magnetoresistance element assembly further comprises:
   means for forming a second stack of material layers disposed over the substrate, comprising:
      second reference layers comprising a second reference magnetic direction;
      second bias layers comprising a second bias magnetic direction; and
      second free layers experiencing the second bias magnetic direction,
   wherein the first and second reference magnetic directions are parallel to each other, wherein, a relative angle between the first reference magnetic direction and the first bias magnetic direction is between fifty and eighty-five degrees or between ninety-five and one hundred thirty degrees, wherein the second bias magnetic direction is parallel to and opposite to the first bias magnetic direction, and wherein the first bias magnetic direction and the second bias magnetic direction are each substantially parallel to a largest surface of the substrate.

20. The magnetoresistance element assembly of claim 19, wherein the second stack of material layers is disposed over the first stack of material layers and the first stack of material layers is disposed upon the substrate.

21. The magnetoresistance element assembly of claim 20, further comprising:
   in a first annealing step, means for annealing the first and second stacks of material layers, resulting in the first and second reference layers having the first reference magnetic direction; and
   in a second annealing step, means for annealing the first and second stacks of material layers, resulting in the first bias layers having the first bias magnetic direction, and resulting in the second bias layers having the second bias magnetic direction.

22. The magnetoresistance element assembly of claim 19, wherein the second stack of material layers is disposed upon a substrate and the first stack of material layers is disposed upon the substrate to the side of the second stack of material layers.

23. The magnetoresistance element assembly of claim 22, wherein the first and second stacks of material layers are electrically coupled in parallel or in series.

24. The magnetoresistance element assembly of claim 23, further comprising:
   in a first annealing step, means for annealing the first and second stacks of material layers, resulting in the first and second reference layers having the first reference magnetic direction;
   in a second annealing step, means for annealing the first and second stacks of material layers, resulting in the first bias layers having the first bias magnetic direction, and resulting in the second bias layers having the first bias magnetic direction; and
   in a rebiasing step, means for rebiasing the second stack of material layer; resulting in the second bias layers having the second bias magnetic direction.

25. The magnetoresistance element assembly of claim 19, wherein the first and second material stacks each comprise a respective yoke shape with a longest dimension and a smallest dimension perpendicular to the longest dimension.

26. The magnetoresistance element assembly of claim 25, wherein the first and second reference magnetic directions are substantially parallel to the smallest dimension.

27. The magnetoresistance element of claim 19, wherein the first reference magnetic direction and the second reference magnetic direction are each substantially parallel to the major surface of the substrate.

* * * * *

UNITED STATES PATENT AND TRADEMARK OFFICE
CERTIFICATE OF CORRECTION

PATENT NO. : 10,840,001 B2
APPLICATION NO. : 15/913072
DATED : November 17, 2020
INVENTOR(S) : Rémy Lassalle-Balier et al.

It is certified that error appears in the above-identified patent and that said Letters Patent is hereby corrected as shown below:

In the Specification

Column 1, Line 46 delete "magnetoresistances" and replace with --magnetoresistance--.

Column 3, Line 58 delete "is pictorial" and replace with --is a pictorial--.

Column 3, Line 61 delete "is pictorial" and replace with --is a pictorial--.

Column 3, Line 65 delete "is pictorial" and replace with --is a pictorial--.

Column 4, Line 1 delete "is pictorial" and replace with --is a pictorial--.

Column 4, Line 41 delete "element," and replace with --elements,--.

Column 4, Line 58 delete "term" and replace with --terms--.

Column 5, Line 39 delete "parallel and perpendicular" and replace with --"parallel" and "perpendicular"--.

Column 5, Line 45 delete "and the term "about"" and replace with --and "about"--.

Column 5, Line 55 delete "Terms" and replace with --The terms--.

Column 7, Line 31 delete "shape" and replace with --shape.--.

Column 7, Line 34 delete "examples" and replace with --example--.

Column 8, Line 10 delete "508, 508" and replace with --506, 508--.

Column 9, Line 44 delete "thirty" and replace with --thirty degrees--.

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,840,001 B2

Column 10, Line 56 delete "then" and replace with --than--.

Column 11, Line 4 delete "a first an" and replace with --a first--.

Column 12, Line 9 delete "for" and replace with --for a--.

Column 12, Line 21 delete "signal" and replace with --single--.

Column 12, Line 28 delete "for" and replace with --for a --.

Column 12, Line 56 delete "for" and replace with --for a--.

Column 12, Line 66 delete "cure" and replace with --curve--.

Column 13, Line 10 delete "signal" and replace with --single--.

Column 13, Line 27 delete "defined" and replace with --defined.--.

Column 13, Line 45 delete "> 0.37" and replace with --$\geq$ 0.37--.

Column 13, Line 54 delete "Repining" and replace with --Repinning--.